United States Patent [19]
Strauss et al.

[11] Patent Number: 5,939,921
[45] Date of Patent: Aug. 17, 1999

[54] DRIVE CIRCUIT FOR A FIELD-EFFECT-CONTROLLED SEMICONDUCTOR COMPONENT WHICH OPENS A SWITCH WHEN A PREDETERMINED CURRENT IS EXCEEDED

[75] Inventors: Silvester Strauss, St. Egyden; Heinz Zitta, Drobollach, both of Austria

[73] Assignee: Siemens Aktiengesellschaft, Munich, Germany

[21] Appl. No.: 08/914,841

[22] Filed: Aug. 19, 1997

[30] Foreign Application Priority Data

Aug. 19, 1996 [DE] Germany .......................... 196 33 367

[51] Int. Cl.$^6$ ...................................................... H03K 5/08
[52] U.S. Cl. .......................... 327/322; 327/109; 327/324; 327/434; 361/55
[58] Field of Search ...................................... 327/538, 540, 327/541, 542, 543, 108, 109, 427, 434, 68, 74, 205, 206, 544, 309, 313, 318, 322, 324; 361/55

[56] References Cited

U.S. PATENT DOCUMENTS

| | | | |
|---|---|---|---|
| 4,755,741 | 7/1988 | Nelson | 323/389 |
| 4,890,009 | 12/1989 | Miyazaki et al. | 307/270 |
| 5,500,619 | 3/1996 | Miyasaka | 327/427 |
| 5,570,060 | 10/1996 | Edwards | 327/541 |

FOREIGN PATENT DOCUMENTS

| | | |
|---|---|---|
| 0476365A1 | 3/1992 | European Pat. Off. . |
| 3936544A1 | 6/1990 | Germany . |
| 4429716C1 | 2/1996 | Germany . |

*Primary Examiner*—Kenneth B. Wells
*Assistant Examiner*—Hai L. Nguyen
*Attorney, Agent, or Firm*—Herbert L. Lerner; Laurence A. Greenberg

[57] ABSTRACT

A drive circuit for a field-effect-controlled semiconductor component reduces a charging current for driving the field-effect-controlled semiconductor component when a load current limiting responds. That prevents an increase in current consumption of the drive circuit while maintaining a short switching time.

9 Claims, 1 Drawing Sheet

DRIVE CIRCUIT FOR A FIELD-EFFECT-CONTROLLED SEMICONDUCTOR COMPONENT WHICH OPENS A SWITCH WHEN A PREDETERMINED CURRENT IS EXCEEDED

BACKGROUND OF THE INVENTION

Field of the Invention

The invention relates to a circuit configuration for driving a field-effect-controllable semiconductor component carrying a load current, including a source circuit connected to a control input of the field-effect-controlled semiconductor component, and a controllable resistor connected in parallel with the control input of the field-effect-controlled semiconductor component, the controllable resistor to be controlled by a device acquiring part of the load current that is proportional to the load current.

Such a circuit configuration is generally known and has been described in German Patent DE 44 29 716 C1, for example.

The gate of the semiconductor component in that case is driven through the use of a current mirror. The controllable resistor is a transistor. If the load current $I_L$ measured at the source terminal of the semiconductor component exceeds a defined value, the transistor is turned on and therefore the gate voltage of the semiconductor component is reduced. The load current $I_L$ is consequently limited.

A disadvantage of that circuit configuration is that when the transistor is turned on, the current consumption of the drive circuit through the input terminal is increased.

If the current discharging the gate is limited by a resistor in order to prevent that, then the switching time of the semiconductor component is prolonged.

SUMMARY OF THE INVENTION

It is accordingly an object of the invention to provide a drive circuit for a field-effect-controlled semiconductor component, which overcomes the hereinafore-mentioned disadvantages of the heretofore-known devices of this general type in such a way that short switching times are achieved and, at the same time, in conjunction with responsive current limiting, the current consumption of the drive circuit does not increase.

With the foregoing and other objects in view there is provided, in accordance with the invention, a circuit configuration for driving a field-effect-controlled semiconductor component, in particular a field-effect-controlled power semiconductor component, carrying a load current and having a control input, comprising a controllable resistor connected in parallel with the control input of the field-effect-controlled semiconductor component; a first source circuit connected to the control input of the field-effect-controlled semiconductor component; a second source circuit independent of the first source circuit; and a switch for supplementarily connecting the second source circuit to the first source circuit; and a device for acquiring a part of the load current proportional to the load current, for controlling the controllable resistor and for driving the switch for opening the switch when a predetermined current is exceeded.

In accordance with another feature of the invention, the source circuits are current source circuits connected in parallel when the switch is closed. The currents of the current source circuits are consequently added. In this way the drive circuit according to the invention becomes particularly simple in terms of circuitry.

In accordance with yet another feature of the invention, there is provided an inverter having an output, the device supplying a switching signal for driving the switch, and the switch and the device forming a switch at the output of the inverter being closed in a quiescent state.

In order to enhance the functional reliability of the drive circuit, the switch is not driven directly, but rather through the inverter. The inverter converts the analog switching signal for the switch into a signal having virtually only two possible states (high and low).

The inverter is constructed by using CMOS technology and therefore has a low power consumption.

In accordance with a further feature of the invention, the switch is constructed as a MOSFET. Consequently the switch switches off completely or switches on completely.

In accordance with an added feature of the invention, the drive circuit is supplied with current exclusively through its input terminal. Therefore, it is not necessary to provide an external operating voltage.

In accordance with an additional feature of the invention, there is provided a current mirror having transistors, the current mirror connected between the input terminal and an input of the inverter, and there is provided a transistor connected between the current mirror and ground.

In accordance with yet a further feature of the invention, the inverter includes a p-channel MOSFET and an n-channel MOSFET having a gate side connected to one another and a drain side connected to one another, the gate side forming the input and the drain side forming the output of the inverter.

In accordance with yet an added feature of the invention, the transistors of the current mirror are first and second transistors, and there is provided a third transistor forming another current mirror with the first transistor and a fourth transistor forming a further current mirror with the first transistor, the other and further current mirrors forming the current source circuits.

Since the current mirrors for providing the current for the inverter and those of the current source circuits are combined to form a current bank, it is possible to save transistors.

In accordance with a concomitant feature of the invention, the current source circuits are formed of MOSFETs.

With the exception of the two bipolar transistors, all of the transistors can be MOSFETs, with the result that the drive circuit is preferably produced by using integrated technology.

Other features which are considered as characteristic for the invention are set forth in the appended claims.

Although the invention is illustrated and described herein as embodied in a drive circuit for a field-effect-controlled semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
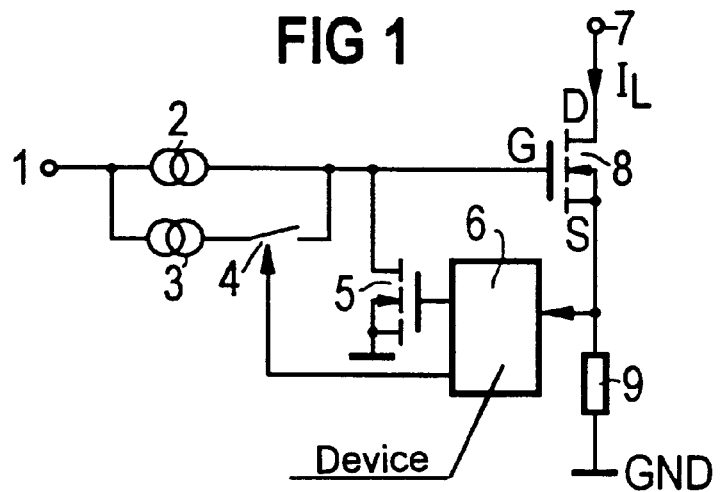
FIG. 1 is a basic schematic and block circuit diagram of the invention.

Referring now to the figures of the drawings in detail and first, particularly, to FIG. 1 thereof, there is seen a circuit configuration that contains a field-effect-controlled semiconductor component 8, which in this case is a power MOSFET. The power MOSFET 8 has a drain terminal designated by reference symbol D, a source terminal designated by reference symbol S and a gate terminal designated reference symbol G. A load current $I_L$ flows through the power MOSFET 8. A measuring resistor 9 is connected between the source terminal S and ground GND. The source terminal S is connected to a device 6 which acquires part of the load current $I_L$ that is proportional to the load current $I_L$.

A parallel circuit formed by a current source circuit 2 and a current source circuit 3, which is connected in series with a switch 4, is connected between the gate terminal G and an input terminal 1 of the circuit configuration. The current source circuit 2 is independent of the current source circuit 3. A control contact of the switch 4 is connected to one output of the device 6. A controllable resistor 5, in the form of a transistor having a control input which is connected to another output of the device 6, is located between the gate terminal G and ground GND.

Figure 2:
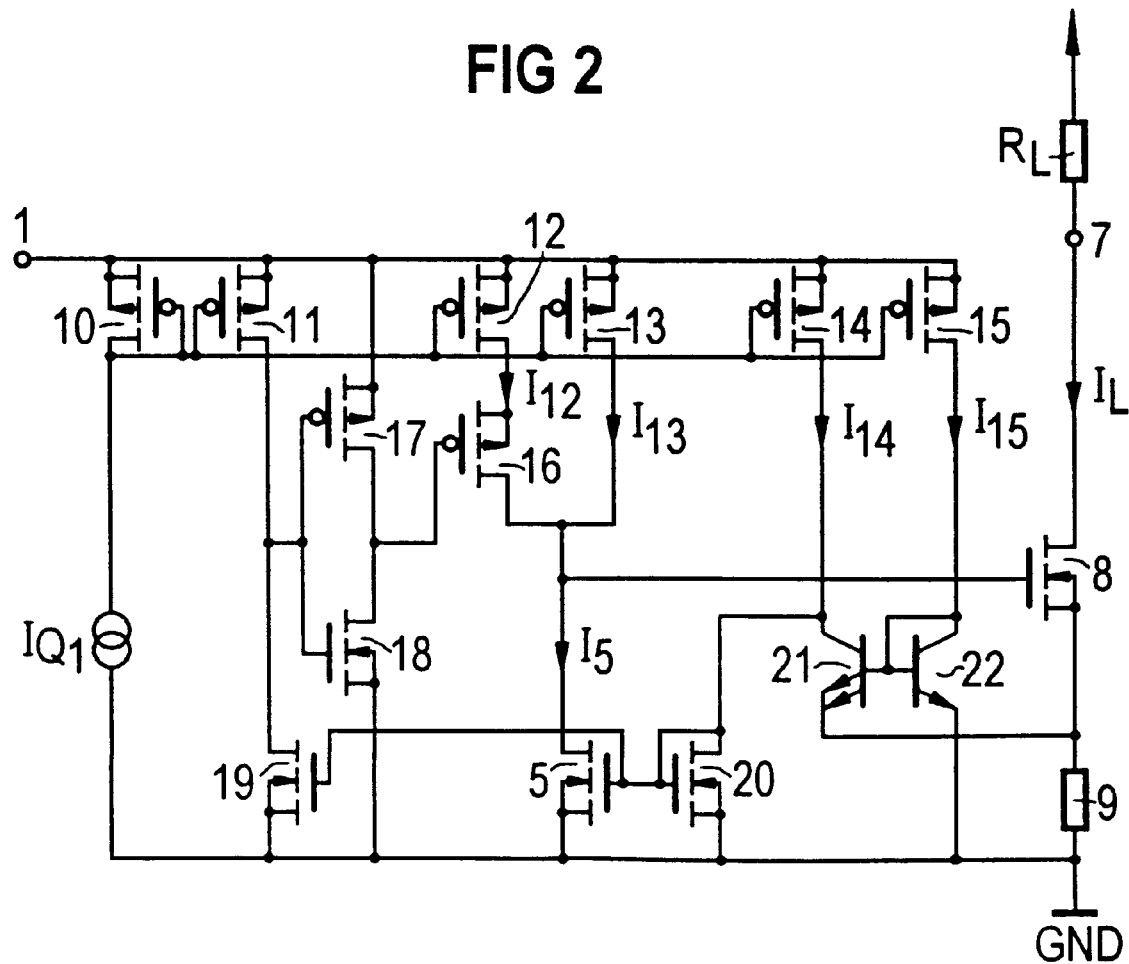
FIG. 2 is a schematic circuit diagram of an exemplary embodiment of the invention.

If the load current $I_L$ is below a threshold, which is determined by the dimensioning of the measuring resistor 9 and the dimensioning of the device 6, then the switch 4 is closed and the transistor 5 is in the off state. Enough current is available for a short switching time of the power MOSFET 8. When the threshold is exceeded, the switch 4 is opened by the device 6 and the transistor 5 is turned on by the device 6. As a result, the charging current to the gate terminal of the power MOSFET 8 is reduced. An input current at the input terminal 1 is then determined only by the source circuit 2. The current consumption of the drive circuit is not increased. The power MOSFET 8, the measuring resistor 9 and the transistor 5 once again appear in the exemplary embodiment according to FIG. 2. In this case, the current source circuit 2 is formed of a current mirror made of transistors 10 and 13, while the current source circuit 3 is formed of a current mirror made of transistors 10 and 12. Both current mirrors mirror a reference current of a current source $I_{Q1}$ disposed between ground GND and a drain terminal of the transistor 10.

The switch 4 in this case is formed of a MOSFET 16. The MOSFET 16 has a gate connected to an output of an inverter, which is formed of a p-channel MOSFET 17 and an n-channel MOSFET 18. Drain terminals of the FETs 17 and 18 are connected to one another to form the output of the inverter. The FET 17 has a source terminal connected to the input terminal 1. The FET 18 has a source terminal connected to ground GND. The FETs 17 and 18 have interconnected gate terminals which form an input of the inverter. A transistor 11 forms a current mirror with the transistor 10. The input of the inverter is connected to a drain terminal of the transistor 11 on one hand and to a drain terminal of a transistor 19 on the other hand. The transistor 19 has a source terminal connected to ground GND and a gate terminal connected to a gate terminal of the transistor 5. Source terminals of the transistors 10 to 13 are connected to the input terminal 1. Transistors 14 and 15 also have source terminals connected to the input terminal 1. The transistors 10, 11, 12 and 13 may be referred to as first, second, third and fourth transistors.

When a voltage is applied to the input terminal 1, the MOSFET 16 is in the on state and the transistor 5 is in the off state as long as the load current $I_L$ is below the predetermined current limiting threshold. As a result, there is enough current available, through the transistors 12 and 13, at the gate terminal of the power MOSFET 8, and the latter switches rapidly.

The transistors 14 and 15 supply currents $I_{14}$ and $I_{15}$, which have the same magnitude. An npn transistor 21 has a larger emitter area than an npn transistor 22. In order to ensure that a collector current of the transistor 21 is equal in terms of magnitude to a collector current of the transistor 22, a base-emitter voltage of the npn transistor 21 must be less than that of the npn transistor 22. Therefore, if the load current $I_L$ increases, then the voltage drop across the measuring resistor 9 becomes larger and the base-emitter voltage across the npn transistor 21 drops. As a result, the collector current of the latter becomes smaller. That proportion of the current $I_{14}$ which does not flow through the npn transistor 21 is amplified through the use of a current mirror formed of the transistor 5 and a transistor 20, and the gate of the power MOSFET 8 is discharged. The load current $I_L$ is limited. A larger current $I_5$ would then also flow away to ground through the transistor 5 and would consequently increase the input current at the input terminal 1. This is prevented by virtue of the fact that the transistor 19 switches on as soon as the transistor 5 is switched on. The input of the inverter goes to ground (switching state low) and, as a result, the output goes to a potential such that the MOSFET 16 switches off. A current $I_{12}$ then no longer contributes to the input current at the input terminal 1.

We claim:

1. In a circuit configuration for driving a field-effect-controlled semiconductor component carrying a load current and having a control input, the improvement comprising:

a controllable resistor connected to the control input of the field-effect-controlled semiconductor component and having a load path switched between the control input and a reference potential;

a first source circuit connected to the control input of the field-effect-controlled semiconductor component;

a second source circuit independent of said first source circuit;

a switch for supplementarily connecting said second source circuit to said first source circuit; and a device for acquiring a part of the load current proportional to the load current and directly connected to said controllable resistor, for controlling said controllable resistor and for driving said switch for opening said switch when a predetermined current is exceeded.

2. The circuit configuration according to claim 1, wherein said first and second source circuits are current source circuits, and said first and second current source circuits are connected in parallel in a closed state of said switch.

3. The circuit configuration according to claim 2, including an inverter having an output, said device supplying a switching signal for driving said switch, and said switch and said device forming a switch at the output of said inverter being closed in a quiescent state of the field-effect-controlled semiconductor component.

4. The circuit configuration according to claim 3, including an input terminal for receiving a current.

5. The circuit configuration according to claim 4, including a current mirror having transistors, said current mirror connected between said input terminal and an input of said inverter, and a transistor connected between said current mirror and ground.

6. The circuit configuration according to claim 5, wherein said inverter includes a p-channel MOSFET and an n-channel MOSFET having a gate side connected to one another and a drain side connected to one another, the gate side forming the input and the drain side forming the output of said inverter.

7. The circuit configuration according to claim 1, wherein said switch is a MOSFET.

8. The circuit configuration according to claim 5, wherein said transistors of said current mirror are first and second transistors, and including a third transistor forming another current mirror with said first transistor and a fourth transistor forming a further current mirror with said first transistor, said other and further current mirrors forming said current source circuits.

9. The circuit configuration according to claim 2, wherein said current source circuits are formed of MOSFETs.

* * * * *